Nov. 29, 1966 G. M. BERGER 3,289,088
AUTOMATIC NON-LINEAR GAIN CONTROL CIRCUIT
Filed May 29, 1963
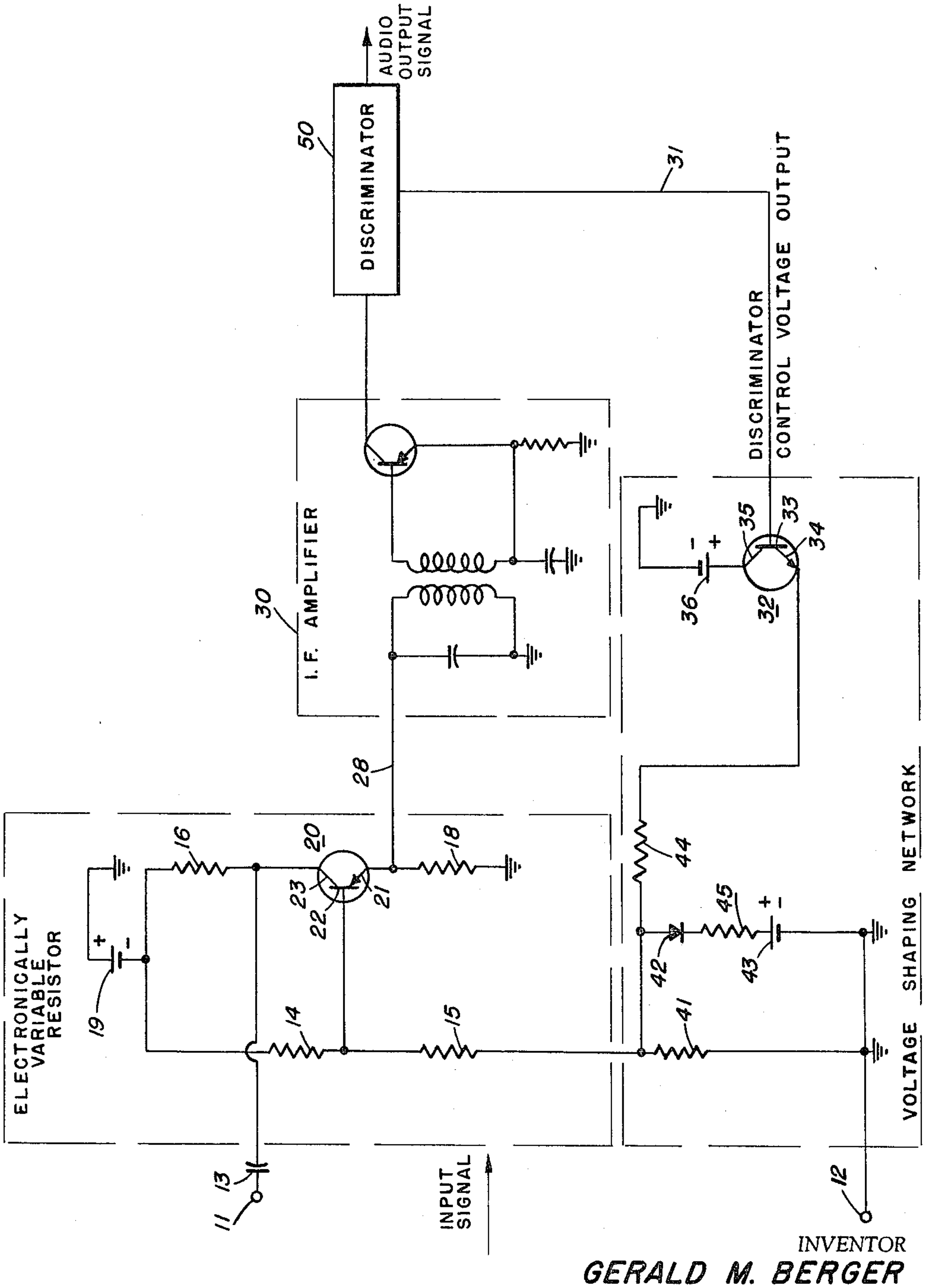
INVENTOR
GERALD M. BERGER
BY Claude Funkhouser
ATTORNEY United States Patent Office 3,289,088
Patented Nov. 29, 1966

3,289,088
AUTOMATIC NON-LINEAR GAIN CONTROL CIRCUIT

Gerald M. Berger, Skokie, Ill., assignor, by mesne assignments, to the United States of America as represented by the Secretary of the Navy Filed May 29, 1963, Ser. No. 284,273
2 Claims. (Cl. 325—408)

The present invention relates generally to electrical circuitry and more particularly to an electronic signal translation network whose output voltage is proportional to the logarithm of its input voltage.

A number of arrangements have been devised for producing a logarithmic response output in signal translation systems. One of the most common of these arrangements is having several stages of intermediate amplifiers to drive individual detectors. The summation of the detected outputs, as each stage reaches saturation, produces the desired logarithmic characteristics. Another arrangement uses a plurality of cascaded amplifier stages each having an output coupled to a section of a delay line, the time delay of each section being added in a termination circuit to give a logarithmic output. A third arrangement uses a mechanically actuated impedance element which varies as the output of an automatic gain control voltage. Such prior art devices have only been capable of use with amplitude modulation detectors and could not be used with discriminator output type detectors without involving the use of critical and complex circuitry.

An object of the present invention is the provision of an electronic network in an electronic signal translation system to vary the output signal of the system as a non-linear function of the input signal to the system.

An object of the invention is to provide an electronic network in an electronic signal translation system which gives an output signal that is a logarithmic function of the input signal.

Another object of the invention is to provide a simple, non-critical electronic circuit in an electronic signal translation system to vary the output signal of the system as a logarithmic function of the input signal.

Still another object of the present invention is the provision of an electronic circuit for use in amplitude, frequency and phase modulation signal translation systems to give a logarithmic output signal with respect to the input signal of the system.

Other objects, advantages and novel features of the invention will become apparent from the following detailed description of the invention when considered in conjunction with the accompanying drawings wherein:

The figure is a schematic diagram of a typical embodiment of the invention.

Referring specifically to the figure of the accompanying drawing, amplitude phase or frequency modulated signals are applied across input terminals 11 and 12, respectively, and coupled via a coupling capacitor 13 to the collector element 23 of three element PNP transistor 20, a collector load resistor 16 connecting the collector 23 to a negative voltage 19 which has its positive side at ground potential. The transistor 20 further has a base element 22 connected between resistor 14 and resistor 15, these resistors forming part of a voltage divider network. Resistor 14 is connected at one end to the negative terminal of voltage source 19, and connected at its other end in series relationship with resistor 15, which is connected to resistor 41, the other end of resistor 41 being connected to ground potential. The emitter element 21 is connected through an emitter resistor 18 to ground potential. Lead 28 connected between emitter element 21 and resistor 18 feeds the signal output from transistor 20 to diagram block 30, a conventional intermediate amplifier stage, partially shown. The output of this intermediate amplifier stage is fed to diagram block 50, a conventional demodulation circuit such as a discriminator detector circuit. Lead 31 is connected from diagram block 50 to the base element 35 of transistor 32 of a voltage shaping network. The transistor 32 has a collector element 35 connected to the positive terminal of voltage source 36; the negative side of the voltage source being connected to ground potential. The emitter element 34 is coupled through a resistor 44 to the anode side of a diode 42 which is connected between resistor 15 and resistor 41 of the voltage divided network. The side opposite the anode of diode 42 is coupled through resistor 45 to a positive bias voltage source 43, the negative side of the voltage source 43 being connected at ground potential.

The circuit described operates as follows:

Input signals from a signal source which may be a prior intermediate amplifier stage, or any other appropriate signal source in a signal translation system, are coupled through capacitor 13 to the collector element 23 of transistor 20. According to technqiues generally known in the art, the magnitude of resistance exhibited between a transistor's emitter-collector such as in transistor 20 may be varied over a wide range of resistance values with an externally small control current. Thus, the input signal is coupled to transistor 20 in order to appear across the emitter-collector and a fixed emitter resistor 18. As the transistor 20 changes resistance by variation of the control current at its base 22, the signal voltage varies across fixed emitter resistor 18. This makes a variable attenuation circuit which can be used to control the amplitude of an input signal to an intermediate frequency amplifier 30. The signal voltage appears across emitter resistance 18 and is coupled by line 28 to the input circuits of a conventional intermediate frequency amplifier 30. The input signal is amplified by intermediate frequency amplifier 30 and fed into a conventional demodulation circuit, shown as a discriminator circuit 50, but other demodulation circuits may be used with other systems. The control current is obtained for transistor 20 by a voltage network of fixed resistors 14, 15, and 41 positioned across supply voltage source 19.

The circuit of transistor 20 will not in itself produce a true logarithmic response and therefore it must be used in conjunction with a voltage shaping network which will properly shape the control current to the base 22 of transistor 20. A control voltage is derived by conventional means from the discriminator circuit 50 and fed via line 31 to transistor 32. This transistor 32 has a source of voltage 36 connected from the collector element 36 to ground potential. The emitter 34 is connected via a current limiting resistor 44 to the anode of diode 42 through resistor 45 to a fixed source of voltage 43, one side of which is connected to ground potential. The diode 42 is biased by fixed voltage 43 at a desired operating point. As the control voltage to transistor 32 varies, the current through its emitter circuit changes as the impedance of diode 42 changes. Inasmuch as diode 42 is non-linear device, its impedance will change under different conditions of current and voltage. This change is reflected across voltage divider resistors 14, 15, and 41, thus changing the control current to the base element 22 of transistor 20 in a non-linear manner.

Due to the extreme versatility of the circuit, adjustment of the circuit parameters will provide any desired response characteristics.

Obviously many modifications and variations of the present invention are possible in the light of the above teachings. It is therefore to be understood that within the scope of the appended claims the invention may be practiced otherwise than as specifically described.

What is claimed is:

1. In a signal translation system having an electronically controlled variable resistance for controlling an input signal to an intermediate frequency amplifier stage for providing a logarithmic output voltage comprising:

first and second input terminals, a signal voltage applied to said terminals, a first transistor having base, collector and emitter elements, a fixed emitter resistance coupled from the first transistor emitter element to ground potential, coupling capacitor coupled between the first of said input terminals and said collector element, said input signal coupled via the coupling capacitor to the first transistor collector element for providing the signal voltage across the first transistor collector-emitter and said fixed emitter resistance, said fixed emitter resistance being coupled to the input of said intermediate frequency amplifier for providing amplification of said signal voltage, a detection stage coupled to the output of the said intermediate frequency amplifier for demodulating the signal input voltage, a second transistor having base, emitter and collector elements, and means for coupling a control voltage developed in said detection stage to the base of the second transistor, said emitter of the second transistor coupled through a resistor diode circuit to ground potential, said resistor diode circuit developing a bias current for controlling the impedance of said first transistor, and means for coupling the bias current to the base of said first transistor, whereby the input signal voltage appearing across the emitter-collector of the first transistor and the fixed resistor is attenuated in response to the variation of the bias current developed in the resistor diode circuit thereby providing an output signal varied in accordance with the variation of the bias current.

2. An electronically controlled variable resistance as set forth in claim 1 wherein:

said resistor diode circuit includes, a resistor coupled in parallel relationship with said diode and ground potential, and a fixed voltage means coupled in series relationship with said diode to ground potential, whereby the voltage appearing across the resistor diode circuit varies as a function of the current flow through the diode.

References Cited by the Examiner

UNITED STATES PATENTS

| | | | |
|---|---|---|---|
| 2,877,348 | 3/1959 | Wade | 328—145 |
| 3,030,504 | 4/1962 | Oschmann | 330—40 |
| 3,108,197 | 10/1963 | Levin | 307—88.5 |
| 3,172,040 | 3/1965 | Schultz | 325—410 |

DAVID J. GALVIN, *Primary Examiner.*